United States Patent [19]

Jackson

[11] Patent Number: 4,839,858

[45] Date of Patent: Jun. 13, 1989

[54] SERRATED MAGNETIC RANDOM MEMORY CELL AND MEANS FOR CONNECTING A PAIR OF ADJACENT CELLS

[75] Inventor: John F. Jackson, Baltimore, Md.

[73] Assignee: Westinghouse Electric Corp., Pittsburgh, Pa.

[21] Appl. No.: 933,516

[22] Filed: Nov. 21, 1986

[51] Int. Cl.$^4$ .............................................. G11C 19/08
[52] U.S. Cl. .................................... 365/87; 365/158
[58] Field of Search ................. 365/87, 171, 158, 8

[56] References Cited

U.S. PATENT DOCUMENTS

| | | | |
|---|---|---|---|
| 3,432,828 | 3/1969 | Barker et al. | 365/171 |
| 3,774,182 | 11/1973 | Copeland, III | 340/174 |
| 3,868,659 | 2/1975 | Schwee | 340/174 |
| 3,868,660 | 2/1975 | Schwee | 340/174 |
| 3,883,858 | 5/1975 | Lienhard et al. | 340/174 |
| 3,906,466 | 9/1975 | Lo et al. | 340/174 |
| 4,001,795 | 1/1977 | Lo et al. | 340/174 |
| 4,024,515 | 5/1977 | Torok et al. | 340/174 |
| 4,024,516 | 5/1977 | Torok | 340/174 |
| 4,075,612 | 2/1978 | Johnson et al. | 365/171 |
| 4,075,613 | 2/1978 | Torok | 365/87 |
| 4,080,591 | 3/1978 | Torok | 365/171 |
| 4,100,609 | 7/1978 | Schwee et al. | 365/87 |
| 4,130,888 | 12/1978 | Paul et al. | 365/87 |
| 4,161,789 | 7/1979 | Torok et al. | 365/87 |
| 4,192,012 | 3/1980 | Schwee et al. | 365/87 |
| 4,198,686 | 4/1980 | Nelson et al. | 365/79 |
| 4,199,819 | 4/1980 | Schwee et al. | 365/87 |
| 4,208,725 | 6/1980 | Paul et al. | 365/87 |
| 4,231,107 | 10/1980 | Schwee et al. | 365/87 |
| 4,246,647 | 1/1981 | Johnson et al. | 365/8 |
| 4,250,565 | 2/1981 | Cosimini et al. | 365/87 |
| 4,253,160 | 2/1981 | Paul et al. | 365/87 |
| 4,253,161 | 2/1981 | Paul et al. | 365/87 |
| 4,347,583 | 8/1982 | Scranton | 365/87 |
| 4,473,893 | 9/1984 | Zierhut et al. | 365/87 |

OTHER PUBLICATIONS

Liu, et al., "Crossties and Spikes on Geometrically Defined Tracks," (date unknown).
Schwee et al., "The Crosstie Memory," IEEE Transactions on Magnetics, vol. MAG-12, No. 6, pp. 608-613, Nov. 1976.
Schwee, "Stability conditions for Neel Walls and Cross-Tie Walls in Thin Magnetic Films," AIP Conf. Proc. 10, MMM Conf., pp. 996-1000, 1972.
Sery, "Dynamic Crosstie Nucleation Thresholds for Crosstie Memory," IEEE Transactions on Magnetics, vol. MAG-11, No. 1, pp. 29-30, Jan. 1975.

*Primary Examiner*—James W. Moffitt
*Attorney, Agent, or Firm*—J. C. Spadacene

[57] ABSTRACT

A random access thin film magnetic memory is provided. Individual memory elements, characterized by serrated edges, are separated by connecting regions. Each connecting region has a polygonal-shaped opening therein with a first pair of adjoining edges having a length longer than the lengths of the remaining adjoining edges. Each memory element may be independently addressed through overlying row and column conductors to either read or write data into the element, and may contain a logic "zero" or "one" determined by the state of the magnetic domain found in the element.

11 Claims, 4 Drawing Sheets

SERRATED MAGNETIC RANDOM MEMORY CELL AND MEANS FOR CONNECTING A PAIR OF ADJACENT CELLS

BACKGROUND OF THE INVENTION

The present invention relates to magnetic memory cells used to store digital electronic data, and more particularly to an improved magnetic memory cell which functions as a random access memory.

The dipole magnetic moments of neighboring atoms within a small region, or domain, of a thin film of magnetic material align themselves when placed in a sufficiently strong external magnetic field. This alignment of magnetic dipole moments is unique to magnetic materials (Fe, Co, Ni, Gd and Dy) and takes place despite the random motion generally undergone by atoms within any material. The material orientation of the magnetic dipole moments remains after the external magnetic field is removed.

Transition regions exist between any two domains which do not have the same alignment of magnetic dipoles. The transition regions between such domains are called domain walls. Different types of domain walls typically exist in magnetic material, each unique as to the orientation of the magnetic field existing within or comprising the domain wall. Within the type of domain wall referred to as a Neel wall, the magnetic field rotates in the plane of the film 180°, thus separating two antiparallel domains. Reversing the magnetic field direction in a small portion of a Neel wall results in the creation of a different type of domain wall, the cross tie. The cross tie magnetization constitutes a separate stable magnetic domain.

The characteristic magnetic fields of the domain wall types remains unchanged in the absence of an external magnetic field of a predetermined strength. In the presence of an external field of the predetermined strength, however, the magnetic state of a domain wall at any given location can be changed.

The stable magnetic domain states of the magnetic film represented by the domain wall magnetization fields may be utilized within a memory system for the storage of digital data. U.S. Pat. No. 3,868,659, issued on Feb. 25, 1975 to Leonard J. Schwee, discusses the use of thin film magnetic materials as data storage devices. A more recent disclosure of such use of thin film magnetic materials is contained in U.S. Pat. No. 4,246,647, which on Jan. 20, 1981 to Johnson et al. In both of those patents, the memory disclosed is a serial memory, i.e., once a data bit is entered at one end of the memory, it is passed through the memory and cannot be removed until all data entered ahead of it has been removed. The operation of such a memory is fully described in the above-referenced patents. Such a serial memory has obvious limitations, in that it is often desirable to randomly access data which has been stored in the memory. In a serial access memory, to access a given data bit, it is necessary to first read out all data which was entered before the data bit of interest.

Long serial access type magnetic memory systems, such as the ones described above, are subject to drawbacks in that the magnetic fields within the thin film strips are easily disturbed by the ambient external magnetic fields which exist in the area surrounding the magnetic memory system, thus disturbing the location of the Neel walls or the cross-ties and the data these features represent. The lengthy Neel walls which exist in such serial memories are particularly easy to disturb, and have a tendency to move from the center of the magnetic strip to one side on the other of the strip. As a result of these disadvantages, there are many opportunities for error in reading and writing into such a memory.

SUMMARY OF THE INVENTION

One object of the present invention is to overcome the problems and disadvantages of the prior art serial access memories by providing a random access magnetic thin film memory system within which each memory element may be randomly accessed to either read or change the data bit stored upon it.

It is an additional object of the present invention to provide a random access magnetic thin film memory system in which there is less chance for error in reading and writing into a particular memory cell.

It is a still further object of the present invention to provide a magnetic thin film memory system on which the effects of ambient electromagnetic fields may be minimized.

Additional objects and advantages of the invention will be set forth in the description which follows; and in part will be obvious from the description, or may be learned by practice of the invention. The objects and advantages of the invention may be realized and obtained by means of the instrumentalities and combinations particularly pointed out in the appended claims.

To achieve the objects and in accordance with the purpose of the invention, as embodied and broadly described herein, the random access magnetic thin film memory system of the present invention comprises a thin strip of magneto-resistive material disposed upon an insulating substrate, a plurality of memory elements defined within the thin film by having a serrated edge pattern thereto, with each memory element being separated from the other memory elements by a non-serrated connecting region of the magneto-resistive material having a void therein, the system having a plurality of spaced conductor means insulated from and overlying the memory elements for detecting or changing the memory state of those memory elements and having conventional control electronics connected to the spaced conductor means to read data stored in or to write data into the memory.

The accompanying drawings, which are incorporated in and constitute a part of this application, illustrate one embodiment of the invention and, together with the description, serve to explain the principles of the invention.

DESCRIPTION OF THE PREFERRED EMBODIMENT

Figure 1:
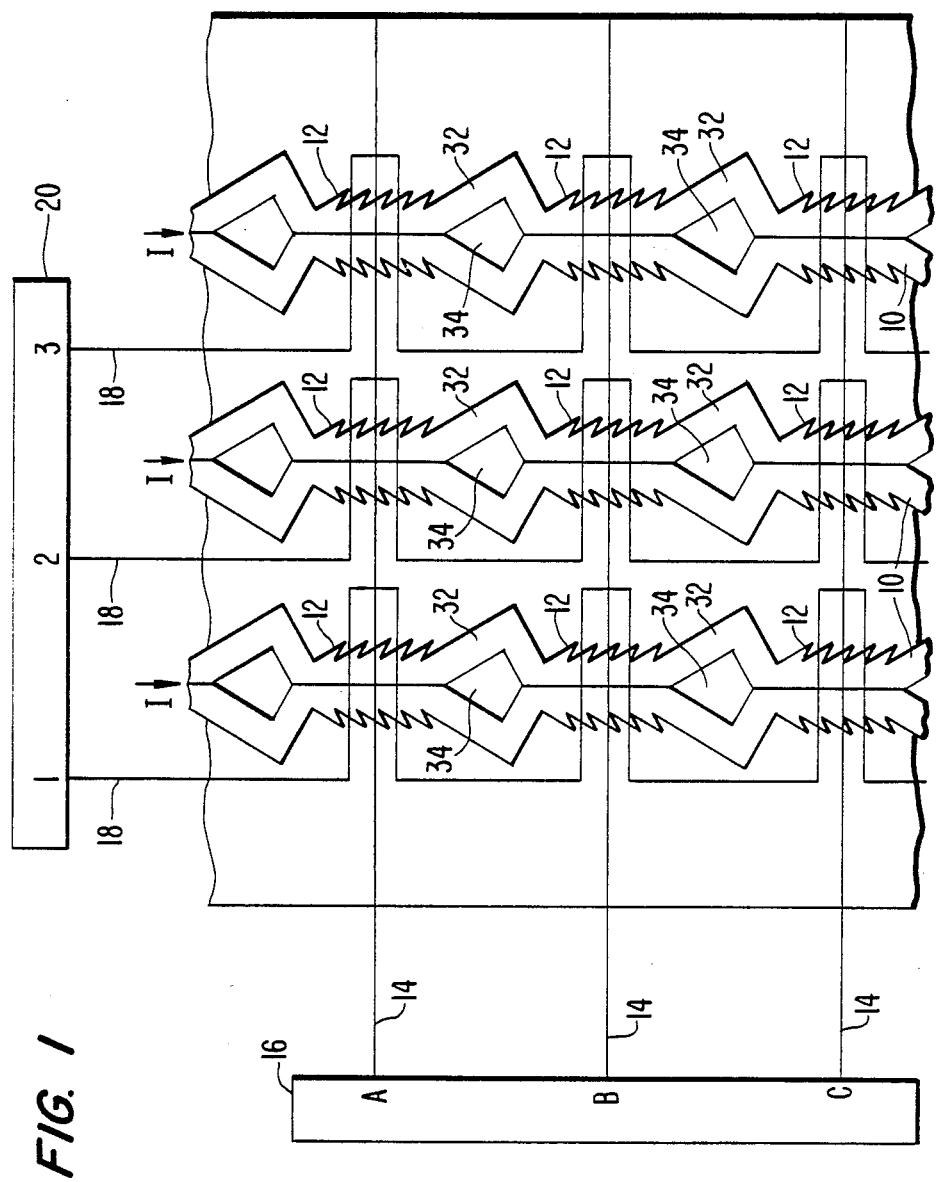
FIG. 1 is a highly magnified view of a portion of a serrated random access memory (SRAM) according to the present preferred embodiment of the invention.

Referring now to FIG. 1, which is a highly magnified view of a portion of a SRAM according to the present invention, a description of a random access memory constructed according to the present invention will be described. FIG. 1 illustrates a plurality of strips 10 of magnetic memory material, each containing a plurality of memory cells 12 and connecting regions 32. The memory cells 12 are arranged in rows A B and C and columns 1, 2 and 3. Also shown are row conductors 14 which pass over each memory cell 12 in a row and which are connected to row decoder 16. Column conductors 18 are also shown which pass over each memory ell 12 in a column and which are connected to a column decoder 20.

Figure 2:
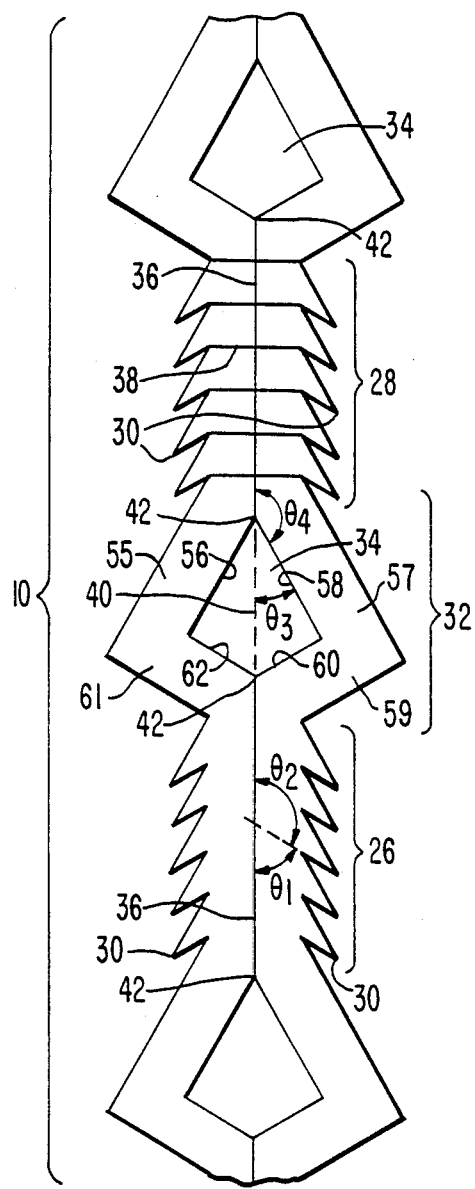
FIG. 2 is a highly magnified fragmentary view of the memory of FIG. 1 illustrating a portion of the film strip of magneto-resistive material.

Referring to FIG. 2, two memory cells 26 and 28 from a memory system according to the present invention are illustrated. The memory cells are constituted by the areas of the thin film strip 10 having serrated side or edge portions 30 with one edge of each serration longer than the other. The serrations are preferably shaped so that if they were extended to the centerline 40 of the strip of magnetic material 10, angles $\theta_1$ and $\theta_2$ would be formed, as shown in FIG. 2. Angle $\theta_1$ should always be an acute angle, while angle $\theta_2$ should always be an obtuse angle. The value of $\theta_1$ should vary between 0° and 90°, while the value of $\theta_2$ is equal to 180° minus $\theta_1$. Typically, the memory element is preferably 15 micrometers wide from one serration tip to the other, and 8 micrometers side at its narrow point, under the serrations. The magnetic strip may be typically 400 Angstroms thick, for example. FIG. 2 illustrates five serrations per memory cell, but any number, e.g., from two to ten or more, may be employed. As will be explained later, the number of serrations employed will effect the memory element's resistance to the effects of ambient magnetic fields, and will also determine the signal level needed to read or write data into the memory element.

Between the two memory elements 26 and 28 is a non-serrated connecting region 32 which may be a polygonal shaped portion of the magnetic film with an internal void 34 existing therein. In accordance with the embodiment of FIG. 2, void 34 is formed in the shape of a polygon, preferably a quadrangle. Connecting region 32 is formed with two long adjoining sides 55 and 57 of equal length and two shorter adjoining sides 59 and 61 of equal length to form internal void 34 having two long adjoining edges 56 and 58, and two short adjoining edges 60 and 62, such that void 34 is symmetrical along one axis and non-symmetrical along the other axis. Long adjoining edges magnetic strip 10. Angles $\theta_3$ and $\theta_4$ are approximately equal to angles $\theta_1$ and $\theta_2$ as illustrated in FIG. 2. Therefore, long edges 56 and 58 of void 34 of connecting region 32 are approximately parallel with serrations 30 of memory element 26.

In FIG. 2, the upper memory element 28 illustrated shows the presence of two domain states 36 and 38, which may be chosen to represent either a logic "1" or a logic "0." For purposes of this description, a logic "1" will be represented by the presence of both domain states (a cross tie and a Neel wall). The lower memory element 26 shows the presence of only one domain state 36, and thus contains a logic "0." Domain state 36 is commonly referred to a Neel wall. Domain state 38 is commonly referred to as a cross-tie. In the memory elements of the present invention, a cross-tie 38 will be present across the narrow portions of each memory element as shown in FIG. 2, when a logic "1" is stored in that element. A description of how Neel walls and cross-ties are formed within a memory element will now be provided.

Figure 3A:
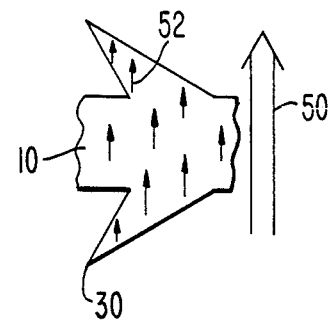
FIG. 3(a) is a highly magnified view of one serrated portion of one memory bell of the present invention, illustrating the alignment of the magnetic dipoles with a strong magnetic field perpendicular to the magnetic film strip.
Figure 3B:
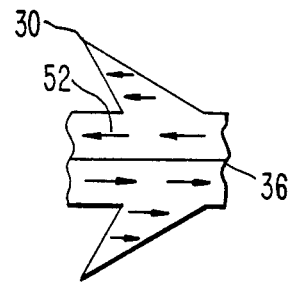
FIG. 3(b) illustrated the alignment of the dipoles in FIG. 3(a) when the strong magnetic field is removed.

When the memory cells illustrated in FIG. 2 are first formed, the magnetic dipoles present in the thin film material can be oriented in random pattern, as they normally are in all magnetic material. Therefore, before use of the cells as memory elements, all the dipoles must be oriented in a consistent manner. FIGS. 3(a) and 3(b) illustrate the initial alignment of the magnetic dipoles. A strong external magnetic field 50 is oriented perpendicular to the magnetic strip 10, which causes the magnetic dipoles 52 to align themselves with the magnetic field, as shown in FIG. 3(a), which illustrates only one serration portion of a memory cell, but which is exemplary of all cells and the connecting regions. Once the strong external magnetic field 50 is removed, the magnetic dipoles 52 will rotate into a stable state, the direction of rotation determined by the smallest angle through which the dipoles 52 must pass to return to the stable state. That rotation is illustrated in FIG. 3(b) by where the dipoles located in the upper half of the strip have rotated to the left, whereas the dipoles located in the lower half of the strip have rotated to the right, as viewed in the drawing. This results in orientation of the dipoles within the strip as shown in FIG. 3(b). The border line or division 36 between the dipoles is referred to as a Neel wall.

A long Neel wall in the middle of a thin film magnetic strip constitutes a very delicate equilibrium condition. As a result, in prior art thin film magnetic strips, in the presence of electronic noise or electromagnetic fields the Neel wall tends to move away from the center of the film, and perhaps attach itself to a side edge of the thin film strip. The present invention solves those problems by providing a connection region 32 between each memory element, and thus allowing for very short Neel walls to be formed, which are less subject to disruption. As shown in FIG. 2, the Neel wall 36 which is formed in each memory element attaches between the two points 42 formed by the void 34 in the connecting region 32. This results in the required Neel wall being very short, and greatly minimizes any chance that the Neel wall will become improperly oriented with respect to the thin film strip.

The orientation of the connecting region 32 between memory cells 12 is critical in increasing the stability of the domains within the thin film strip. Experimentation has shown that although void 34 is necessary to keep to a minimum the length of the Neel walls formed in the memory elements, the void itself can lead to improper magnetic dipole alignment in the connection regions, and thus lead to the disturbance of the magnetic field within the memory cells themselves, if the void is improperly shaped.

Figure 4A:
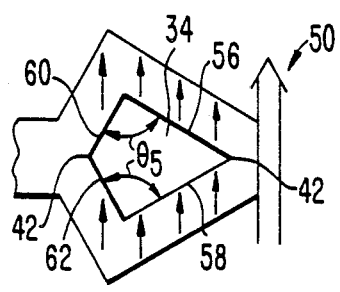
FIG. 4(a) is a highly magnified view of one desired configuration of one of the connecting regions showing the alignment of the magnetic dipoles in that region with a strong magnetic field oriented perpendicular to the magnetic film strip.
Figure 4B:
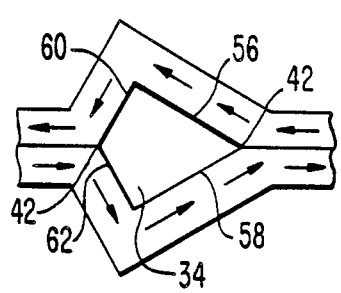
FIG. 4(b) illustrates the alignment of the dipoles in FIG. 4(a) when the strong magnetic field is removed.
Figure 5:
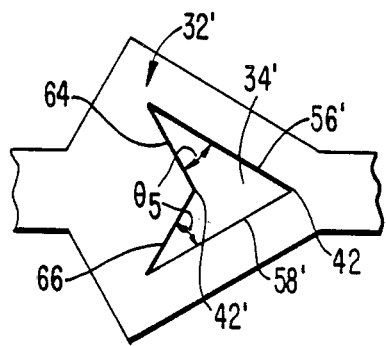
FIG. 5 illustrates an alternate desired configuration of one of the connecting regions.

Experimentation has shown that for best results the void 34 should be shaped substantially as shown in either FIG. 4, or FIG. 5. When void 34 is formed in a quadrilateral shape with two long edges 56 and 58 adjoining two short edges 60 and 62, as shown in FIG. 4(a), the dipoles align themselves correctly upon relaxation of the initial strong magnetic field so that the field forces do not oppose each other in the connecting region. See FIG. 4(b). The domains in the shorter sides 59 and 61 of connecting region 32 are forced into proper alignment by the strength of the field in the longer sides 56 and 58. Therefore, no internal disturbances are created in the magnetic field. FIG. 5 shows an acceptable alternative shape for void 34.

As embodied in FIG. 5, a connecting region 32' has a void 34' with elongated adjoining edges 56' and 58' similar to void 34 of connecting region 32, previously described. Although void 34' is in the form of a nonsymmetrical polygon as void 34 of FIG. 2, void 34' has two adjoining short edges 64 and 66 forming an obtuse angle at point 42'.

Thus, in FIG. 4, the angle $\theta_5$ formed where the long edges 56 and 58 join short edges 60 and 62 are greater than 90 degrees, whereas angles $\theta_5$ in FIG. 5 are less than 90 degrees; and the internal angle formed by shorter sides 64 and 66 is greater than 180 degrees. This alternative shape will also result in proper alignment of the magnetic dipoles within the connecting region. The value of angles 0-5 is not critical, so long as points such as 42 and 42' result, to which the Neel walls attach, as discussed earlier.

As shown in both FIGS. 4 and 5, not only must void 34 and 34' be formed in an elongated fashion, but it must also be formed so that long edges 56, 56' and 58, 58' 30 in the memory cells. This allows the angles $\theta_1$ and $\theta_3$ to be approximately equal, as discussed earlier. In this manner, the magnetic dipoles in both the memory cells 12 and the connecting regions 32 relax in the same direction after the initializing strong magnetic field 50 is relaxed, and consistent magnetic domains are created.

Figure 6:
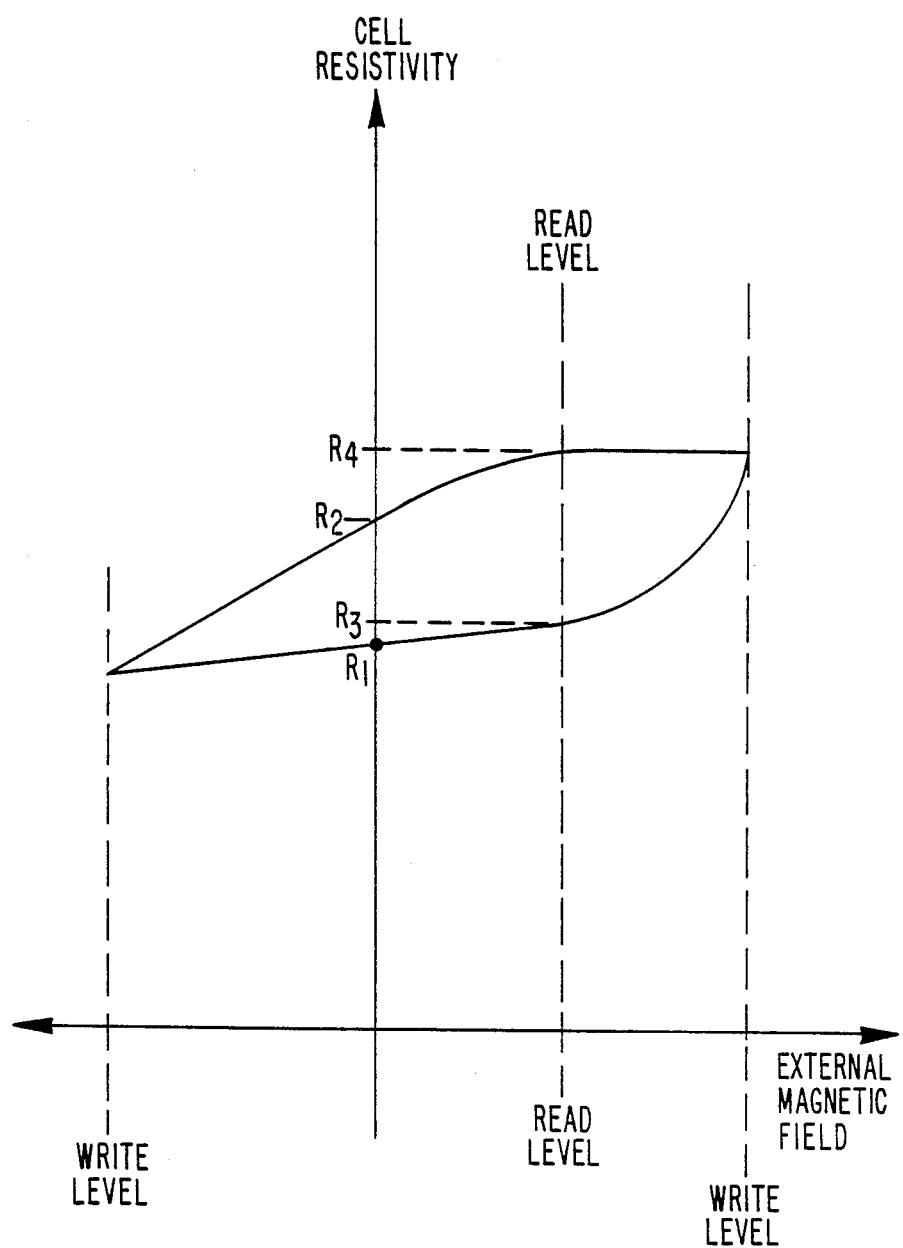
FIG. 6 is a graph showing the relationship of the resistivity of a memory cell of the SRAM of FIG. 1 as a function of the strength of an applied magnetic field.

Reference will now be made to FIG. 6 to explain how data is entered into a memory element of the present invention, and how the data contained in a memory element is read.

FIG. 6 shows the resistivity of a memory element plotted against the strength of a magnetic field applied to that element, and illustrates the magneto-resistive effect which is used to either read or write into a memory element. As the graph illustrates, the resistivity of any given memory element depends upon two factors, the state of the magnetic domains within the element, i.e., whether both a Neel wall and cross-ties are present (a data bit "one" is stored in the element), or whether only a Neel wall is present (a data bit "zero" is stored in the element), and the strength of an applied external field. When no external magnetic field is applied, the resistivity of a memory element will be R1 if that element is in the "zero" state and will be R2 if that element is in the "one" state.

As discussed earlier the state of a memory element, i.e., whether it is a "one" or a "zero" can be changed if a magnetic field of a predetermined strength is applied to the cell. That magnetic field strength is referred to in FIG. 6 as the WRITE LEVEL. When a magnetic field equal or greater than the WRITE LEVEL is applied to a magnetic memory element in the "zero" state, the magnetic dipoles within the element reorient themselves, cross-tie magnetic domains 38 are created, and the resistivity of the element changes, as illustrated in FIG. 6. It is possible to apply a magnetic field of less strength than the WRITE LEVEL, which will cause the resistivity of the element to momentarily change, but which will not cause the state of the memory element, i.e., "one" or "zero," to change. That lesser strength is referred to in FIG. 6 as the READ LEVEL.

With the above principles in mind, a description of how a magnetic element is read will be provided. First, an external magnetic field equal to the READ LEVEL is applied to the memory element. As the external field is applied, a small D.C. current is supplied to the memory element, and the change in the element's resistivity is determined from the voltage developed across the element. As shown in FIG. 6, if the memory element is in the "zero" state, the change in resistivity, from R1 to R3, is small. If the memory element is in the "one" state, however, the change in resistvity, from R2 to R4, is large. Therefore, when a magnetic field equal to the READ LEVEL is applied to a memory element, a large change in the resistivity of the element indicates it is in the "one" state, while a small change indicates it is in the "zero" state.

The difference in the resistivity change from a "one" to a "zero" state results from the different alignment of the magnetic dipoles within the memory element and is maximized as a result of the geometry of the serrated memory elements separated by the connecting regions, as discussed above. Therefore, not only does the shape of the memory elements result in a memory which is more stable and less prone to disruptions due to unintended electromagnetic fields, it also results in an improved ability to detect whether the memory element is in the "one" or "zero" condition.

Referring again to FIG. 6, it may be seen that to change the memory element from a "zero" to a "one," all that is necessary is to apply a magnetic field equal or greater than the WRITE LEVEL oriented in a proper direction relative to the cell. Similarly, to change the element from a "one" to a "zero," one simple applies a similar field oriented in the opposite direction. A "zero" state exists when only a Neel wall is present in the memory element, and a "one" state exists when both a Neel wall and one or more cross-ties are present.

In operation, once a random access memory such as in FIG. 1 is constructed, the individual memory cells must be initialized, or aligned, as is explained in more detail above with reference to FIGS. 3, 4 and 5. This is accomplished by applying a large magnetic field perpendicular to the columns of memory cells. This field is created with external field coils which generate a perpendicular magnetic field to initially align the magnetic moments in the magnetic material and create the Neel walls in each memory element 12 between each connecting region 32.

Data may then be written into the random access magnetic memory system of FIG. 1 as follows. First, the process circuitry of the memory system determines that a data bit should be placed in a specific memory cell. That information is passed to column decoder 20 and row decoder 6, which will determine, for example, that the memory cell located in column 2, row B has been addressed. Current will be passed through row B conductor 14 and column 2 conductor 18. The current sent in either the row or column conductor is not enough to generate an external magnetic field of the WRITE LEVEL strength of FIG. 6. However, because the memory element found in column 2, row B is subject to the magnetic fields generated by both the row B conductor and the column 2 conductor, the magnetic field over that element is equal or greater than the WRITE LEVEL and the data bit is changed. As one of ordinary skill in the art will realize, only the direction of the currents must be changed to write either a "one" or a "zero" into any given memory location. To read any given memory locations, it is only necessary to pass current through either of the row or column conductors to generate a field of the READ LEVEL strength, and thus cause the change in resistivity discussed earlier.

The amount of current required to generate a magnetic field of sufficient strength to change the state of a memory cell is directly related to the number of serrations in that cell. As explained earlier, the number of serrations formed within each memory cell may vary from 2 to 10 or more. As the number of serrations increases, the number of cross-ties which must be created or destroyed by the magnetic field also increase, thus requiring a stronger field. Therefore, the memory of the present invention may be custom designed to withstand varying degrees of ambient electromagnetic fields without damage to the data stored in it.

It will be apparent to those skilled in the art that various modifications and variations can be made in the random access memory of the present invention without departing from the spirit or scope of the invention. It is intended that the present invention cover the modifications and variations of this invention provided they come within the scope of the appended clams and their equivalents.

What is claimed is:

1. A magnetic random access memory comprising:
   an insulating substrate;
   a thin film of magneto-resistive material disposed upon said substrate, said thin film having a plurality of spaced memory elements therein;
   each said memory element being defined by a serrated edge pattern;
   each said memory element being spaced from the other said memory elements by a non-serrated connecting region having a void in the magneto-resistive material, said void defining a polygon-shaped opening in said connecting region symmetrical about one axis thereof and non-symmetrical about an axis substantially perpendicular thereto; and
   a plurality of spaced conductor means, insulated from and overlying said memory elements, for selectively detecting and changing the memory state of any selected one of said memory elements.

2. A magnetic memory as in claim 1, wherein the number of said serrations in said edge pattern of each said memory element determines the amount of energy required to detect or change the state of sad memory element.

3. A magnetic memory as in claim 1 wherein the number of cross-tie magnetic domains which may be created is determined by the number of said serrations in each said memory element.

4. A magnetic memory as in claim 1, wherein there are two of said spaced conductor means overlying each of said memory locations, one of said conductor means representing the row in which said memory location is found, and the other of said conductor means representing the column in which said memory location is found.

5. A magnetic memory as in claim 4, wherein one of said conductor means is energized to detect the state of said memory cell and both of said conductor means are energized to change the state of said memory cell.

6. A magnetic random access memory comprising:
   an insulating substrate;
   a thin film of magneto-resistive material disposed upon said substrate, said thin film having a plurality of spaced memory elements therein;
   each said memory element being defined by a serrated edge pattern;
   each said memory element being spaced from the other said memory elements by a non-serrated connecting region having a polygonal configured void with a pair of adjoining edges longer than the remaining adjoining edges, said first pair of adjoining edges extending substantially parallel to one edge of each said serration and joined at a point central of said serrated edges.

7. A magnetic memory as in claim 6 wherein said void is quadrangular in configuration.

8. A magnetic memory as in claim 7 wherein said void has a diamond configuration symmetrical along one axis and non-symmetrical along another.

9. A magnetic memory as in claim 7 wherein said remaining adjoining edges comprise a pair of edges substantially equal length joined at a point central of the serrated edges, said edges forming an internal angle at said point greater than 180 degrees.

10. A magnetic memory as in claim 6 wherein the serrated edge pattern includes serrated edges each having one edge of each serration longer than the other.

11. A magnetic memory as in claim 7 wherein the thin film of magneto-resistive material has a width of approximately fifteen micrometers from the tip of one serrated side edge to the other.

* * * * *